US006974742B2

(12) United States Patent
Lee

(10) Patent No.: US 6,974,742 B2
(45) Date of Patent: Dec. 13, 2005

(54) METHOD FOR FABRICATING COMPLEMENTARY METAL OXIDE SEMICONDUCTOR IMAGE SENSOR

(75) Inventor: Won-Ho Lee, Ichon-shi (KR)

(73) Assignee: Hynix Semiconductor Inc., (KR)

(*) Notice: Subject to any disclaimer, the term of this patent is extended or adjusted under 35 U.S.C. 154(b) by 137 days.

(21) Appl. No.: 10/745,988

(22) Filed: Dec. 24, 2003

(65) Prior Publication Data

US 2004/0180488 A1 Sep. 16, 2004

(30) Foreign Application Priority Data

Mar. 13, 2003 (KR) .......................... 10-2003-15658

(51) Int. Cl.[7] .................. H01L 21/8238; H01L 21/425
(52) U.S. Cl. ...................... 438/228; 438/525; 257/219
(58) Field of Search ................................ 438/519–521, 438/525–531, 546–549, 217–228; 257/218–221

(56) References Cited

U.S. PATENT DOCUMENTS 6,504,194 B1 * 1/2003 Miida .......................... 257/292

* cited by examiner

Primary Examiner—David Nelms
Assistant Examiner—Calvin Lee
(74) Attorney, Agent, or Firm—Blakely Sokoloff Taylor & Zafman

(57) ABSTRACT

The present invention relates to a method for fabricating a complementary metal oxide semiconductor (CMOS) image sensor, wherein a mini-p-well is stably formed in a pixel region being correspondent to a trend of large scale of integration. The method includes the steps of: preparing a substrate defined with a peripheral region and a pixel region; performing a first ion-implantation process by using a first photoresist having a first thickness to thereby form a normal first conductive well in the pixel region; and performing a second ion-implantation process by using a second photoresist having a second thickness to thereby form a mini-well of the first conductive type in the peripheral region, wherein the first thickness is greater than the second thickness.

14 Claims, 2 Drawing Sheets

METHOD FOR FABRICATING COMPLEMENTARY METAL OXIDE SEMICONDUCTOR IMAGE SENSOR

FIELD OF THE INVENTION

The present invention relates to a method for fabricating a complementary metal oxide semiconductor (CMOS) image sensor; and, more particularly, to a method for fabricating a CMOS image sensor with a micronized p-well stably formed in a pixel region.

DESCRIPTION OF RELATED ARTS

Generally, a complementary metal oxide semiconductor (CMOS) image sensor is a semiconductor device that converts an optical image into an electric signal. The CMOS image sensor includes a photo-detection unit for detecting a light and a logic circuit for processing the detected light into an electric signal, which is, in turn, converted into a corresponding datum. The CMOS technology adopts a switching mode, wherein outputs are sequentially detected by using MOS transistors made with the same number as that of pixels.

Figure 1:
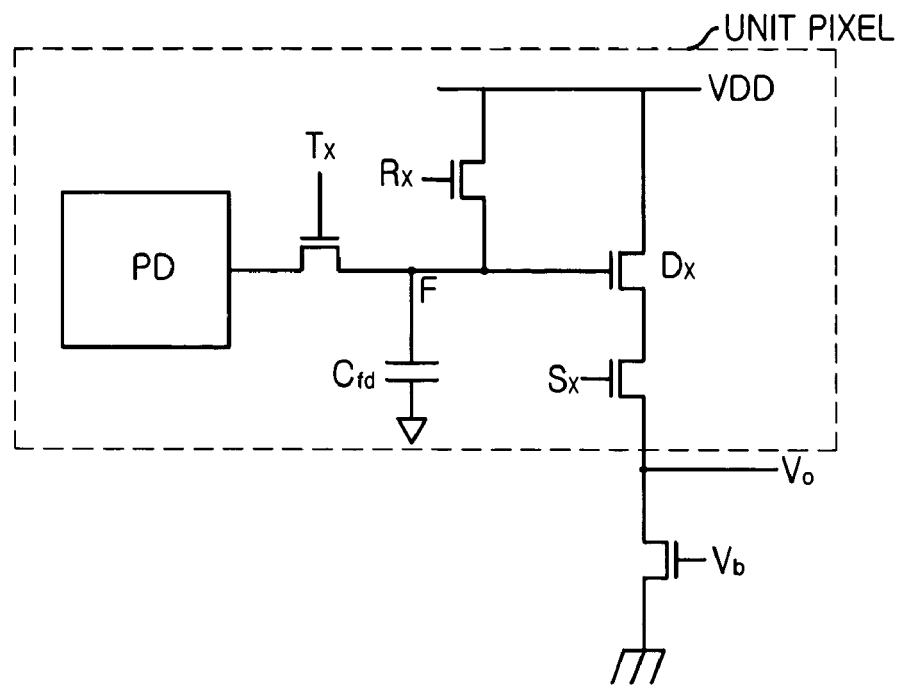

The CMOS image sensor is classified into a pixel region and a peripheral region. Particularly, a pixel array is formed in the pixel region, while N-cannel metal oxide semiconductor (NMOS) and P-channel metal oxide semiconductor (PMOS) transistors are formed in the peripheral region. As shown in FIG. 1, a unit pixel in the pixel array includes one photodiode PD which is a device for collecting light and four transistors such as a transfer transistor Tx, a reset transistor Rx, a drive transistor Dx and a selection transistor Sx. In more detail, the transfer transistor Tx transfers the collected light at the photodiode PD to a floating diffusion node F. The reset transistor Rx sets the floating diffusion node F with an intended electric potential value and then resets the floating diffusion node F with an electric potential value by discharging the photo-generated electric charge. The drive transistor Dx serves as a source follower buffer amplifier, and the selection transistor Sx selectively outputs the electric potential value corresponding to the photo-generated electric charge. Also, there is a capacitance Cfd in the floating diffusion node F, and a load transistor for reading the output signal exists outside of the unit pixel.

Herein, the NMOS transistor in the peripheral region is a normal NOMS transistor. The transfer transistor and the reset transistor Tx and Rx are NOMS transistors in a low threshold voltage or in a depletion mode. The drive transistor and the selection transistor Dx and Sx are NOMS transistors in a typical enhancement mode. Thus, the transfer transistor Tx and the reset transistor Rx are formed as native MOS transistors without a p-well. In contrast, p-wells are formed in the NMOS transistor in the peripheral region and in active regions of the drive transistor and the selection transistor Dx and Sx. In general, the p-well formed in the peripheral region is called a normal p-well, while the p-well formed in the drive transistor and the selection transistor Dx and Sx is called a mini-p-well because of the smaller size of this p-well than that of the normal p-well. For instance, in a 0.35 $\mu$m CMOS image sensor fabrication technology, a normal p-well and a mini-p-well are simultaneously formed by using one mask including a normal p-well mask portion and a mini-p-well portion.

However, because of large-scale of integration, in a 0.18 $\mu$m CMOS image sensor technology, the area of the mini-p-well is decreased to about 0.5 $\mu$m×0.8 $\mu$m as the size of the unit pixel is decreased to about 3 $\mu$m to about 4 $\mu$m. Meanwhile, the depth of the normal p-well becomes deeper, requiring high ion-implantation energy of about 700 keV. Hence, the thickness of a photoresist should be increased to about 20000 Å in order to prevent an incidence of channeling phenomenon during the ion-implantation process with high energy. In order to limit the area of the mini-p-well within a range of about 0.5 $\mu$m to about 0.8 $\mu$m, the thickness of the photoresist needs to be reduced to about 10000 Å with consideration of a mask resolution, and applied ion-implantation energy needs to be changed as well. Since the applied ion-implantation energy dependent on the thickness of the photoresist has a trade-off relationship with the mask resolution, it may be difficult to stably form the mini-p-well in the pixel region.

SUMMARY OF THE INVENTION

It is, therefore, an object of the present invention to provide a complementary metal oxide semiconductor (CMOS) image sensor with a mini-p-well formed stably in a pixel region.

In accordance with an aspect of the present invention, there is provided a method for fabricating a complementary metal oxide semiconductor (CMOS) image sensor, including the steps of: preparing a substrate defined with a peripheral region and a pixel region; performing a first ion-implantation process by using a first photoresist having a first thickness to thereby form a normal first conductive well in the pixel region; and performing a second ion-implantation process by using a second photoresist having a second thickness to thereby form a mini-well of the first conductive type in the peripheral region, wherein the first thickness is greater than the second thickness.

BRIEF DESCRIPTION OF THE DRAWING(S)

The above and other objects and features of the present invention will become apparent from the following description of the preferred embodiments given in conjunction with the accompanying drawings, in which:

FIG. 1 is a circuit diagram showing a unit pixel of a conventional complementary metal oxide semiconductor (CMOS) image sensor; and FIGS. 2A to 2D are cross-sectional views illustrating a method for fabricating a CMOS image sensor in accordance with a preferred embodiment of the present invention.

DETAILED DESCRIPTION OF THE INVENTION

Hereinafter, a preferred embodiment of the present invention will be described in detail with reference to the accompanying drawings.

FIGS. 2A to 2D are cross-sectional views illustrating a method for fabricating a complementary metal oxide semiconductor (CMOS) image sensor in accordance with a preferred embodiment of the present invention.

Figure 2A:
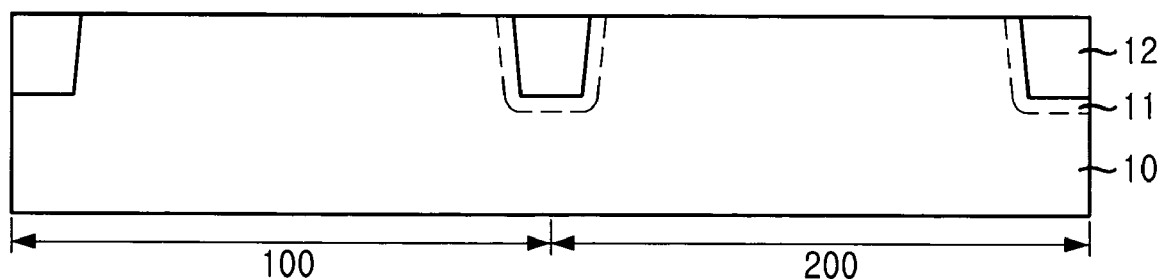

Referring to FIG. 2A, a plurality of trenches are formed in a substrate 10 with use of a hard mask (not shown) made of nitride to divide the substrate 10 into a peripheral region 100 and a pixel region 200. Then, in order to provide a field edge shielding effect in the pixel region 200 and realize properties of a native N-channel metal oxide semiconductor (NMOS) transistor, an N-channel stop region 11 is formed through an N-channel stop ion-implantation technique such that it encompasses each trench formed in the pixel region

200. After the formation of the N-channel stop region 11, an oxide layer is deposited thereon until being filled into each trench. A chemical mechanical polishing (CMP) process is performed to form a plurality of field oxide layers 12 each with a shallow trench isolation (STI) structure.

Figure 2B:
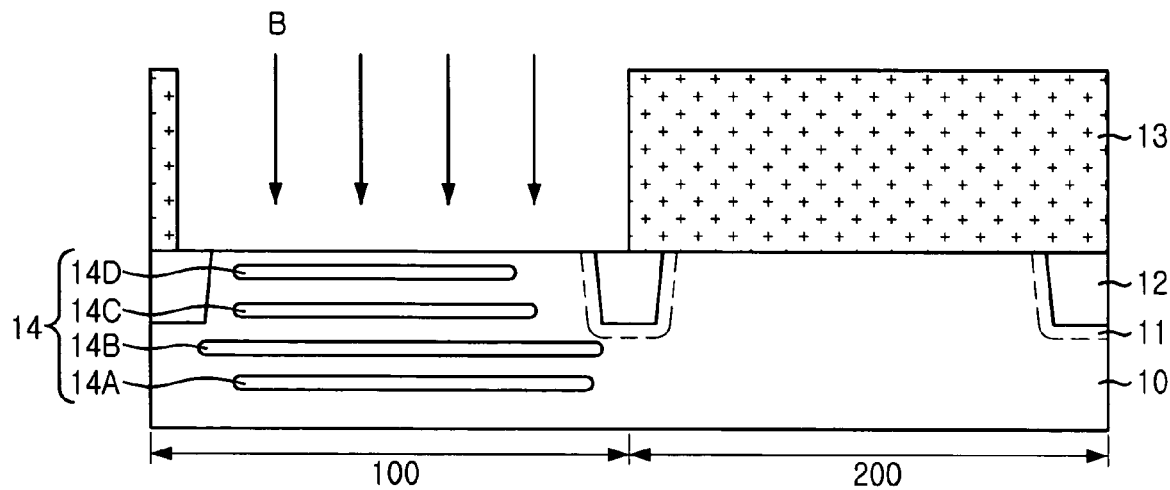

Referring to FIG. 2B, a first photoresist layer is deposited on an entire surface of the above resulting structure and is subjected to a photo-exposure and developing process to form a first photoresist pattern 13 opening a normal p-well region in which the NMOS transistor is formed in the peripheral region 100. Herein, the first photoresist layer can be formed with a thickness greater than about 20000 Å since the first photoresist pattern 13 is patterned in a manner to open only the normal p-well region. As a result, a subsequent ion-implantation process using a high level of energy can be performed without inducing a channeling phenomenon.

Next, the above mentioned ion-implantation process is consecutively applied to the opened normal p-well region. From this consecutive ion-implantation process, first p-type impurity ions, preferably boron (B) ions, are sequentially ion-implanted under variable conditions with different concentrations and energy levels to form a normal p-well 14. Preferably, the above consecutive ion-implantation process includes a first ion-implantation process for forming a first normal p-well 14A for an electric isolation of the normal p-well 14, a second ion-implantation process for forming a second normal p-well 14B for reinforcing a punchthrough characteristic of the filed oxide layer 12, a third ion-implantation process for forming a third normal p-well 14C for reinforcing a punchthrough characteristic of the transistor and a fourth ion-implantation process for forming a fourth normal p-well 14D for controlling a threshold voltage. At this time, each ion-implantation process proceeds by giving four times of rotation with respectively different angles of about 0 degree, about 90 degrees, about 180 degrees and about 270 degrees.

More preferably, the first ion-implantation process, the second ion-implantation process, the third ion-implantation process and the fourth ion-implantation process are performed with a respective concentration of about $5.0\times10^{12}\times4/cm^3$, about $1.5\times10^{12}\times4/cm^3$, about $5.0\times10^{11}\times4/cm^3$ and about $2.0\times10^{12}\times4/cm^3$ and a respective energy of about 350 KeV, about 150 KeV, about 80 KeV and about 20 KeV. Herein, the reason for notating the ion-implantation concentration as the above is to indicate that each ion-implantation process proceeds by giving four times of rotation with respectively different angles along with the use of a predetermined ion-implantation concentration. Thus, the above mentioned concentration is the total concentration of the p-type impurity ions used in the ion-implantation process. Hereinafter, the same notation for the ion-implantation concentration will be used for such ion-implantation process.

Figure 2C:
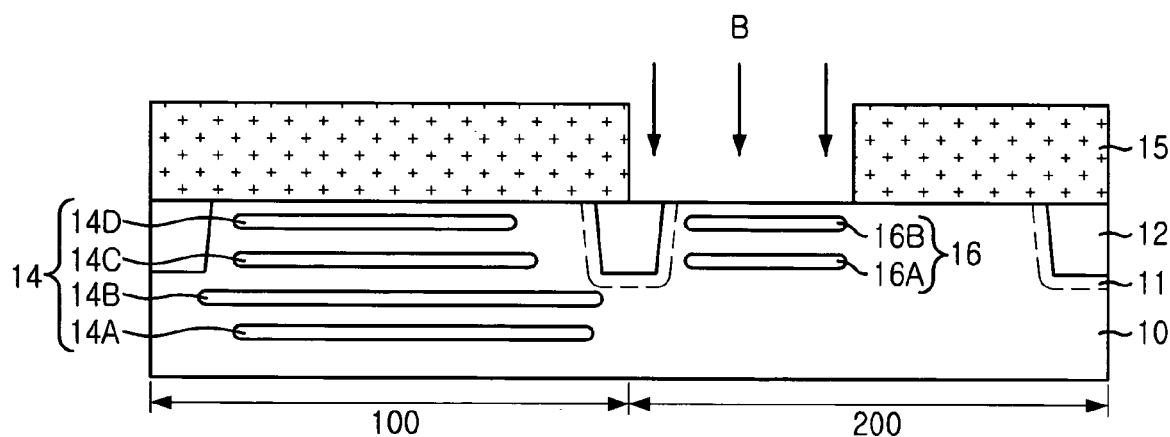

Referring to FIG. 2C, the first photoresist pattern 13 is removed by the known technology. Then, a second photoresist layer is deposited thereon and is subjected to a photo-exposure and developing process with use of a mask for use in a mini-p-well (not shown). From this photo-exposure and developing process, a second photoresist pattern 15 opening only a mini-p-well region for forming a driving transistor and a selection transistor in the pixel region 200 is formed. Herein, it is possible to form the second photoresist layer with a thin thickness because of the completion of the normal p-well formation process requiring the ion-implantation technique with high energy. At this time, the thickness of the second photoresist layer is less than about 10000 Å. Thus, it is further possible to limit the area of the mini-p-well within a range of about 0.5 μm to about 0.8 μm.

Subsequently, second p-type impurity ions, preferably boron (B) ions, are ion-implanted into the opened mini-p-well region in the pixel region 200 by performing an ion-implantation process twice under variable conditions with different concentrations and energy levels. From this consecutive ion-implantation process, a mini-p-well 16 is formed. Preferably, the consecutive ion-implantation process includes a first ion-implantation process for forming a first mini-p-well 16A for reinforcing a punchthrough characteristic of the transistor and a second ion-implantation process for forming a second mini-p-well 16B for controlling a threshold voltage. Herein, the first and the second mini-p-wells 16A and 16B serve similar roles with the third and the fourth normal p-wells 14C and 14D. Thus, the similar ion-implantation process conditions applied to form the third and the fourth normal p-wells 14C and 14D are applied to form the first and the second mini-p-wells 16A and 16B. More preferably, the first and the second ion-implantation processes are performed with a respective concentration of about $5.0\times10^{11}\times4/cm^3$ and $2.0\times10^{12}\times4/cm^3$ and a respective energy of about 80 KeV and about 20 KeV.

Figure 2D:
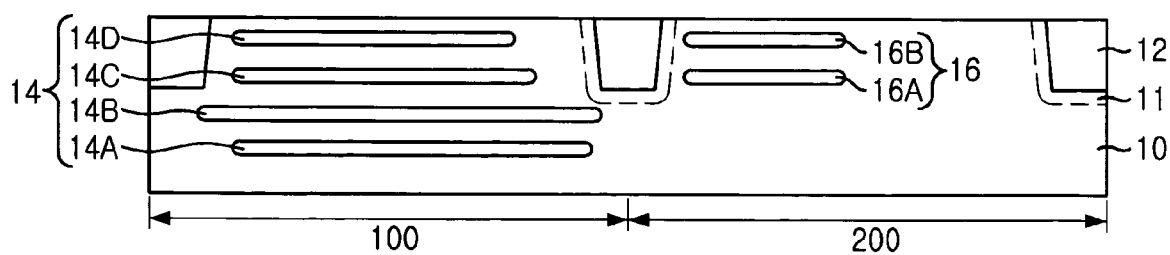

Referring to FIG. 2D, the second photoresist pattern 15 is removed by using the known technology. Although not illustrated, transistors are formed in the peripheral region 100 and the pixel region 200 by performing subsequent processes.

On the basis of the preferred embodiment of the present invention, each photoresist layer is formed with a different thickness by separately applying the normal p-well mask and the mini-p-well mask. Therefore, the mini-p-well of which area is decreased due to large scale of integration can be stably formed in the pixel region. Also, characteristics of these transistors can be optimized since the punchthrough characteristic of the drive transistor and the selection transistor in the mini-p-well and the threshold voltage can be controlled independently.

Meanwhile, although the mini-p-well is formed in the pixel region by performing the consecutive ion-implantation process including the first and the second ion-implantation processes, it is still possible to form the mini-p-well by employing only the second ion-implantation process. At this time, the second ion-implantation process is carried out by applying a concentration of about $2.0\times10^{12}\times4/cm^3$ and energy of about 20 KeV or by applying a concentration of about $2.4\times10^{12}\times4/cm^3$ and energy of about 20 KeV.

In accordance with the preferred embodiment of the present invention, the photoresist layers are formed with different thicknesses by separately applying the normal p-well mask and the mini-p-well mask. Thus, it is possible to stably form the mini-p-well of which area becomes smaller because of the large scale of integration in the pixel region and to optimize the characteristics of the drive transistor and the selection transistor formed in the mini-p-well. As a result, it is further possible to improve reliability and characteristics of the CMOS image sensor.

While the present invention has been described with respect to certain preferred embodiments, it will be apparent to those skilled in the art that various changes and modifications may be made without departing from the scope of the invention as defined in the following claims.

What is claimed is:

1. A method for fabricating a complementary metal oxide semiconductor (CMOS) image sensor, comprising the steps of:

preparing a substrate defined with a peripheral region and a pixel region;

performing a first ion-implantation process by using a first photoresist having a first thickness to thereby form a normal first conductive well in the peripheral region; and performing a second ion-implantation process by using a second photoresist having a second thickness to thereby form a mini-well of the first conductive type in the pixel region, wherein the first thickness is greater than the second thickness.

2. The method as recited in claim 1, wherein the first conductive impurity is a p-type impurity and the p-type impurity is boron ion.

3. The method as recited in claim 1, wherein the first thickness is greater than about 20000 Å while the second thickness is less than about 10000 Å.

4. The method as recited in claim 1, wherein the first ion-implantation process includes the steps of:

forming the first photoresist pattern opening the peripheral region on the substrate;

forming the normal first conductive well in the opened peripheral region by sequentially ion-implanting a first conductive type impurity ion through the use of a consecutive ion implantation process; and removing the first photoresist pattern.

5. The method as recited in claim 4, wherein at the step of forming the normal fist conductive well, the consecutive ion-implantation process proceeds by performing an ion-implantation process four times with variable conditions with different concentrations and energy levels.

6. The method as recited in claim 5, wherein each ion-implantation process proceeds by giving four times of rotation with respectively different angles of about 0 degree, about 90 degrees, about 180 degrees and about 270 degrees.

7. The method as recited in claim 5, wherein the consecutive ion-implantation process includes:

a third ion-implantation process performed by applying a concentration of about $5.0 \times 10^{12} \times 4/cm^3$ and energy of about 350 KeV;

a fourth ion-implantation process performed by applying a concentration of about $1.5 \times 10^{12} \times 4/cm^3$ and energy of about 150 KeV;

a fifth ion-implantation process performed by applying a concentration of about $5.0 \times 10^{11} \times 4/cm^3$ and energy of about 80 KeV; and a sixth ion-implantation process performed by applying a concentration of about $2.0 \times 10^{12} \times 4/cm^3$ and energy of about 20 KeV.

8. The method as recited in claim 1, further comprising the step of forming a plurality of field oxide layers to thereby separate the peripheral region and the pixel region.

9. The method as recited in claim 8, further comprising the step of forming a second conductive channel stop region such that the second conductive channel stop region encompasses each field oxide layer prior to the step of forming the field oxide layers.

10. The method as recited in claim 1, wherein the second ion-implantation process includes the steps of:

forming the second photoresist pattern opening the pixel region on the substrate;

forming the mini-well of the first conductive type in the opened pixel region by sequentially ion-implanting the first conductive type impurity ion through the use of a consecutive ion implantation process; and removing the second photoresist pattern.

11. The method as recited in claim 10, wherein at the step of forming the mini-well of the first conductive type, the consecutive ion-implantation process proceeds by performing an ion-implantation process twice with different concentrations and energy levels or by performing a single ion-implantation process.

12. The method as recited in claim 11, wherein each ion-implantation processes proceeds by giving four times of rotation with respectively different angles of about 0 degree, about 90 degrees, about 180 degrees and about 270 degrees.

13. The method as recited in claim 11, wherein the consecutive ion-implantation process includes:

a first ion-implantation process with a concentration of about $5.0 \times 10^{11} \times 4/cm^3$ and energy of about 80 KeV; and a second ion-implantation process with a concentration ranging from about $2.0 \times 10^{12} \times 4/cm^3$ to about $2.4 \times 10^{12} \times 4/cm^3$ and energy of about 20 KeV.

14. The method as recited in claim 11, wherein the single ion-implantation process is carried out by applying a concentration of about $2.0 \times 10^{12} \times 4/cm^3$ or a concentration of about $2.4 \times 10^{12} \times 4/cm^3$ along with energy of about 20 KeV.

* * * * *